(12) United States Patent
Dingemans et al.

(10) Patent No.: US 10,222,048 B2
(45) Date of Patent: Mar. 5, 2019

(54) LIGHT EMITTING DEVICE AND METHOD FOR MANUFACTURING A LIGHT EMITTING DEVICE

(71) Applicant: PHILIPS LIGHTING HOLDING B.V., Eindhoven (NL)

(72) Inventors: Antonius Petrus Marinus Dingemans, Tilburg (NL); Wilhelmus Gerardus Maria Peels, Valkenswaard (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 114 days.

(21) Appl. No.: 14/383,595

(22) PCT Filed: Mar. 6, 2013

(86) PCT No.: PCT/IB2013/051776
§ 371 (c)(1),
(2) Date: Sep. 8, 2014

(87) PCT Pub. No.: WO2013/132446
PCT Pub. Date: Sep. 12, 2013

(65) Prior Publication Data
US 2015/0109793 A1   Apr. 23, 2015

Related U.S. Application Data

(60) Provisional application No. 61/608,178, filed on Mar. 8, 2012.

(51) Int. Cl.
*F21V 7/00* (2006.01)
*F21V 29/70* (2015.01)
(Continued)

(52) U.S. Cl.
CPC ............... *F21V 29/70* (2015.01); *F21K 9/60* (2016.08); *F21V 5/04* (2013.01); *F21V 7/04* (2013.01);
(Continued)

(58) Field of Classification Search
CPC .... F21V 29/505; F21V 7/0025; F21V 7/0066; F21V 7/0091; F21V 7/06; F21V 29/508; F21Y 2101/02; Y10T 29/4913
(Continued)

(56) References Cited

U.S. PATENT DOCUMENTS 7,282,740 B2  10/2007  Chikugawa et al.
7,728,341 B2   6/2010  Mazzochette et al.
(Continued)

FOREIGN PATENT DOCUMENTS

CN  1806336 A   7/2006
EP  2180233 A1  4/2010
(Continued)

OTHER PUBLICATIONS

Espacenet English Machine Translation of Jenner (WO 2009/0037544) and English Abstract.*

*Primary Examiner* — Zheng Song
(74) *Attorney, Agent, or Firm* — Akarsh P. Belagodu

(57) ABSTRACT

A light emitting device comprising a substrate (6) having an electrically conducting circuit layer (8), a LED package (7) surface mounted on the substrate (6) and electrically connected to the circuit layer (8), and a heat sink element, surface mounted on the substrate (6) separately from the LED package (7), the heat sink element having a body (2) of a heat conductive material surrounding the LED package (7), the body being thermally connected to the circuit layer (8), and being adapted to provide heat dissipation from the circuit layer (8) to a surrounding environment, wherein a
(Continued)

surface (3) of the heat sink element facing the LED package is adapted to form part of a beam shaping optics for shaping light emitted from the LED package. Since the heat sink body is in thermal contact with the circuit layer, the heat resistance from the LED package to the heat sink body via the circuit layer is minimized.

9 Claims, 2 Drawing Sheets

(51) Int. Cl.
    *F21V 7/22*     (2018.01)
    *F21V 23/04*     (2006.01)
    *F21V 29/505*     (2015.01)
    *F21V 5/04*     (2006.01)
    *F21V 7/04*     (2006.01)
    *H01L 33/50*     (2010.01)
    *F21K 9/60*     (2016.01)
    *F21Y 115/10*     (2016.01)

(52) U.S. Cl.
    CPC ............. *F21V 7/22* (2013.01); *F21V 23/0457* (2013.01); *F21V 29/505* (2015.01); *H01L 33/50* (2013.01); *F21V 7/0091* (2013.01); *F21Y 2115/10* (2016.08); *Y10T 29/4913* (2015.01)

(58) Field of Classification Search
    USPC ............... 362/294, 373, 296.01, 345; 257/98
    See application file for complete search history.

(56) References Cited

U.S. PATENT DOCUMENTS

| | | | |
|---|---|---|---|
| 2002/0130326 A1* | 9/2002 | Tamura | F21K 9/00 257/79 |
| 2007/0097696 A1* | 5/2007 | Eng et al. | 362/341 |
| 2008/0142816 A1 | 6/2008 | Bierhuizen et al. | |
| 2008/0291631 A1 | 11/2008 | Hellinger et al. | |
| 2009/0103293 A1 | 4/2009 | Harbers et al. | |
| 2009/0225543 A1 | 9/2009 | Jacobson et al. | |
| 2009/0290346 A1* | 11/2009 | Ogawa et al. | 362/249.01 |
| 2009/0303715 A1 | 12/2009 | Takasago et al. | |
| 2010/0001653 A1* | 1/2010 | Hilgers | G01J 1/04 315/149 |
| 2010/0103679 A1* | 4/2010 | Lee | 362/294 |
| 2010/0164346 A1* | 7/2010 | Li et al. | 313/46 |
| 2010/0165599 A1* | 7/2010 | Allen | 362/84 |
| 2010/0314641 A1* | 12/2010 | Schmidt | 257/98 |
| 2011/0180819 A1* | 7/2011 | Van Elmpt et al. | 257/88 |
| 2011/0254554 A1* | 10/2011 | Harbers | H05B 33/0893 324/414 |
| 2012/0014107 A1* | 1/2012 | Avila | 362/294 |
| 2013/0088876 A1* | 4/2013 | Harbers | F21V 29/00 362/294 |
| 2013/0141918 A1* | 6/2013 | Harbers et al. | 362/294 |
| 2013/0170221 A1* | 7/2013 | Isogai | F21V 7/0033 362/300 |
| 2013/0201690 A1* | 8/2013 | Vissenberg et al. | 362/296.07 |
| 2013/0208484 A1* | 8/2013 | Alfier et al. | 362/294 |

FOREIGN PATENT DOCUMENTS

| | | | |
|---|---|---|---|
| JP | 2010067862 A | 3/2010 | |
| JP | 2010087051 A | 4/2010 | |
| JP | 2010129923 A | 6/2010 | |
| JP | 2011501362 A | 1/2011 | |
| JP | 2012503306 A | 2/2012 | |
| WO | WO2009037544 A2 | 3/2009 | |
| WO | WO2010032169 * | 3/2010 | ............ F21K 99/00 |
| WO | 2011139548 A2 | 11/2011 | |

* cited by examiner

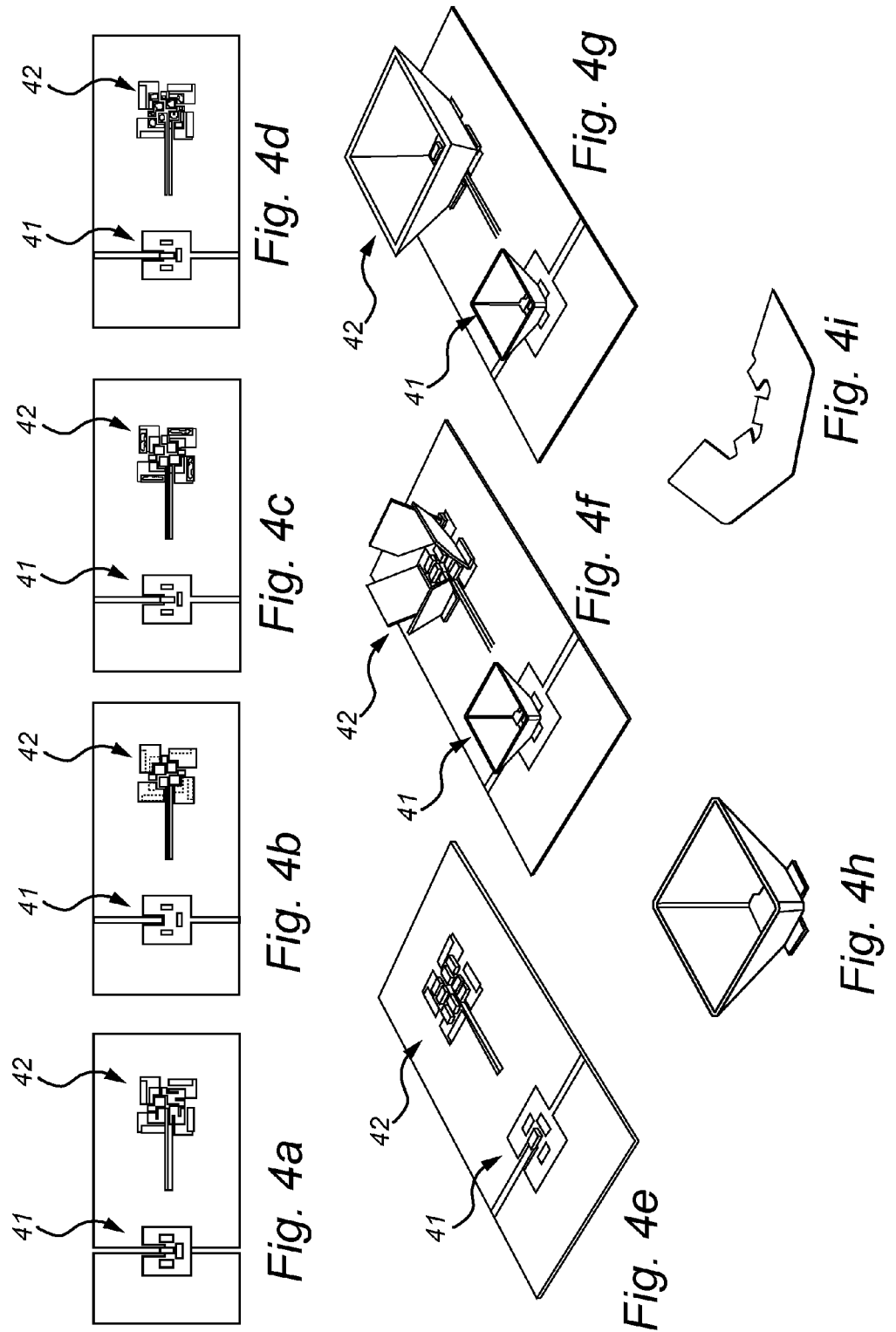

LIGHT EMITTING DEVICE AND METHOD FOR MANUFACTURING A LIGHT EMITTING DEVICE

CROSS-REFERENCE TO PRIOR APPLICATIONS

This application is the U.S. National Phase application under 35 U.S.C. § 371 of International Application No. PCT/IB13/051776, filed on Mar. 6, 2013, which claims the benefit of U.S. Provisional Patent Application No. 61/608,178, filed on Mar. 8, 2012. These applications are hereby incorporated by reference herein.

FIELD OF THE INVENTION

The present invention relates generally to a light emitting device having a heat sink element surface mounted adjacent a LED package on the circuit layer of a substrate. The invention relates also to a method for manufacturing such a light emitting device.

BACKGROUND OF THE INVENTION

In the Light Emitting Diode (LED) industry a variety of different technologies are used when manufacturing a complete functional LED-module that includes the LED-package or die and the necessary wiring or circuits. LED-modules are manufactured in different ways from the typical 5 mm through hole signaling components to Chip on Board. At this moment, for general lighting, surface mounted technology (SMT), is the dominant technology. SMT is automated and places components for an electrical product on a printed circuit board (PCB).

It is a continuing and natural trend in the LED industry to try to make the LED-packages more powerful, having a higher light emission output per surface area. A problem arising when making the LED more powerful is that the LED, in spite of its high energy efficiency, generates heat in amounts affecting the efficiency and lifetime of the LED. It is thus a problem to lead away the heat when increasing the power input/output of the LED-packages.

To solve the heat issue, heat sinks of different kinds are used. A known way is to use capped filled vias in the PCB to lead heat through the PCB to a heat conductor on the backside of the PCB. The heat conductor is often part of a metal heat sink that is exposed to the ambient air. Using vias for heat conduction is, however, both costly and sets demands on electronic insulation, limiting and complicating the design of the component and its PCB.

Another option, disclosed e.g. in U.S. Pat. No. 7,282,740, is to design and manufacture more complex LED packages, with integrated optical and heat sink capabilities. While this partly addresses the problem, it requires specially adapted LED packages. In order to achieve cost efficient production of LED modules, it is normally preferred to use standard LED packages, which are manufactured in large volumes.

Therefore, there is a need for an improved way to achieve satisfactory heat dissipation, which can be implemented in cost efficient manufacturing processes.

SUMMARY OF THE INVENTION

It is an object of the present invention to provide a light emitting device with satisfactory heat dissipation and light emission control, which can be manufactured in a cost efficient manner. This and other objects are achieved by a light emitting device comprising a substrate having an electrically conducting circuit layer, a LED package surface mounted on the substrate and electrically connected to the circuit layer, and a heat sink element, surface mounted on the substrate separately from the LED package. The heat sink element has a body of a heat conductive material surrounding the LED package, the body being in thermal contact with the circuit layer and being adapted to provide heat dissipation from the circuit layer to a surrounding environment. The surface of the heat sink element facing the LED package is further adapted to act as a beam shaper for shaping light emitted from the LED package.

Since the heat sink body is in thermal contact with the circuit layer, the heat resistance from the LED package to the heat sink body via the circuit layer is minimized. As the heat sink element is surface mounted on the substrate (just like the LED package), it may further be arranged very close to, and preferably in direct contact with, the circuit layer. This further reduces the heat resistance from the LED package to the heat sink body.

A LED-package is in this context intended to a component which may be surface mounted on a substrate, and which includes at least one LED die.

The substrate is usually a PCB, but could be any other substrate having an electrically conducting circuit layer onto which LED package and other electrical components may be mounted. The heat sink body, made of a heat conductive material, directs heat to the thermal interface when the surrounding environment is cooler than the heat sink body. The optical interface is arranged facing the LED package to direct light emitted from the LED package. The optical interface typically surrounds the LED package on the substrate.

The surface mounting of the heat sink element on the circuit layer can be done before or after soldering the LED package to the circuit layer, making the mounting of the beam shaping optics an integrated piece in the LED board manufacturing process.

By using standard surface mounting technology, optical and thermal functionalities can be added at the same time, in the same process as is used to mount the LED packages. The heat sink elements are picked, placed and soldered at the same time, using the same processes as for the LED packages. This will save costs enabling possibilities to make cheap LED products with desired emission quality. By choosing a simple heat sink element, cost can be kept low with reasonable quality. By choosing a more sophisticated heat sink element, quality will be very good, due to the good heat dissipation that comes from the direct heat transfer.

If the heat sink element and the LED package are soldered in place, the beam shaping optics will further be self aligned with the LED package, as the solder strives to reach its lowest energy state.

The heat sink element is preferably electrically connected to the circuit layer. This means that the heat sink element will form part of the electrical circuit, and can include components that can be powered and controlled through the circuit. The heat sink element may for example include light sensors (Lm, CTT a.o.) and actuators (shutters) connected to the beam shaping optics. By sensing the light directly in the beam, this may provide very advantageous functionality.

The heat sink body may be made of a metal, e.g. aluminum, copper, preferably a metal having a high heat conductivity. The heat sink body may e.g. be made of a metal sheet or foil, having a reflective surface at a side facing the LED package. This solution is simple, but fairly efficient, providing a cost effective solution.

The heat sink body may also be made of a, at least partly, transparent material. It is not always that it is desired to shape the emission from the LED-package. If the LED should only give diffuse light, the optical heat sink body may be made of a transparent material having incorporated highly reflective particles to increase the scattering coefficient of the material still keeping absorption at low levels.

The surface facing the LED package may be transparent, highly reflective, Lambertian reflective or specular. The choice depends on the optical beam properties wanted, price of the product, etc.

The surface facing the LED package may further be provided with phosphorescent material adapted to convert the color of the LED radiation. As is well known, most high power white LEDs emit light in a narrow blue wavelength region and need to be color converted to be perceived as white by the human eye. This is normally done using phosphor conversion, where a phosphor powder, e.g. YAG:Ce, is excited by the blue LED emission, converting a large portion of the blue emission to a broadband emission in the red region. Adding the phosphor to the optical interface of the optical heat sink body can be done cheaper and with less precision since it can be applied before mounting the optical heat sink. Adding phosphor directly to the LED die is a delicate and thereby expensive operation.

The heat sink element may comprise two electrically and thermally separated parts, each thermally connected to the circuit layer. The two parts may be connected to different terminals of the LED package mounted on the circuit layer, in which case the two parts must be electrically insulated so as to avoid a short circuit. The parts may be separated either by air or a non-conducting material as a ceramic or rubber material. The separating material is preferably pre-mounted to avoid having to place two components onto the substrate. An advantage of connecting the heat sink element to two electrical terminals of the LED package is that heat may be dissipated from two sides of the LED-die.

In a further embodiment of the present invention, the heat sink element further comprises a lens supported by and in thermal connection with the body, which lens is positioned in front of an emission surface of the LED package. In that way, precision beam shaping may be accomplished by surface mounted technology, while keeping the optical lens cooled by the heat sink. The lens could be a molded lens or basically any lens pre-mounted to the heat sink element. Precession mounting of the lens is thus accomplished automatically by the standard SMT. Another advantage is that the lens may be placed very close to the LED-die.

The invention further relates to a method of assembling a light emitting device, comprising providing a surface of a substrate with an electrically conducting circuit layer, surface mounting a LED-package on the substrate, in electrical connection with the circuit layer, and surface mounting a separate heat sink element on the substrate, adjacent to the LED package, such that the heat sink element is brought into thermal connection with the circuit layer, so as to provide heat dissipation from the circuit layer to a surrounding environment.

The mounting steps may be performed using standard SMT processes, with all the benefits following that, as discussed above.

BRIEF DESCRIPTION OF THE DRAWINGS

The above objects, as well as additional objects, features and advantages of the present invention, will be more fully appreciated by reference to the following illustrative and non-limiting detailed description of preferred embodiments of the present invention, when taken in conjunction with the accompanying drawings, wherein:

FIG. 4a is a topographic view of the PCB layout of two embodiments of the present invention.

FIG. 4b is a topographic view of the copper layer layout of the two embodiments in FIG. 4a.

FIG. 4c is a topographic view of the LED footprint of the two embodiments in FIG. 4a.

FIG. 4d is a topographic view of the optical heat sink footprints of the two embodiments in FIG. 4a.

FIG. 4e is a perspective view of the two embodiments of the PCB layout with LEDs, basically a combination of FIG. 4a and FIG. 4c.

FIG. 4f is a perspective view of the two embodiments of FIG. 4e with metal parts of the heat sink element added.

FIG. 4g is a perspective view of the two embodiments of FIG. 4f with material covering the metal parts added to provide embodiments with white cup optical interfaces.

FIGS. 4h and 4i show a folded and a non-folded metal sheet used as heat sink element.

DETAILED DESCRIPTION

Figure 1:
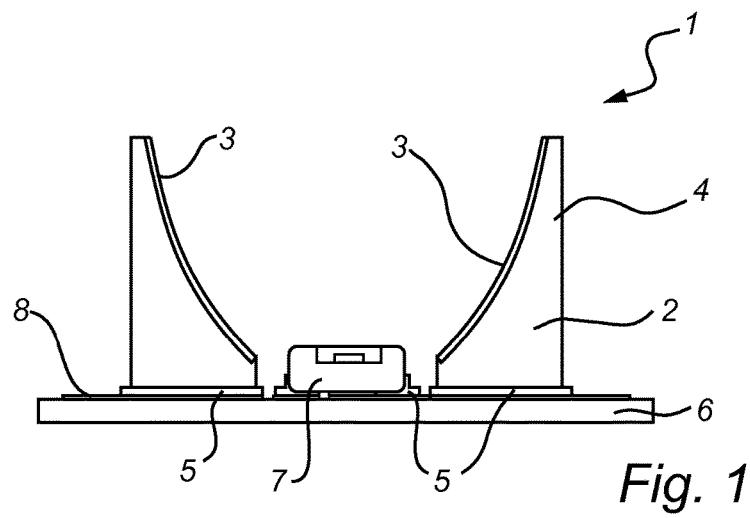
FIG. 1 is a cross sectional view of an embodiment of a light emitting device according to a first embodiment of the present invention.

FIG. 1 shows a cross sectional view of an embodiment of a light emitting device according to the invention, including a substrate 6, here a PCB, onto which a LED package 7 and a heat sink element 1 have been mounted using surface mounting technology (SMT). The heat sink element 1, also referred to as an "optical heat sink", comprises a heat sink body 2 of a heat conductive material, and an optical interface 3, arranged on the surface of the body 2. The optical interface forms part of a beam shaping optics, and may be made of a material providing desired optical properties, and can be transparent, highly reflective lambertian/white or specular. The heat sink body 2 further has a thermal interface 4 exposed to the surrounding environment, usually air. The optical heat sink 1 further has a solder connection 5. The optical heat sink 1 is intended to be connected on the copper wiring 8 of the PCB 6 substrate using the solder connection 5. The optical heat sink is arranged to surround the LED-package 7 so that light from the LED package will be incident on the optical interface 3, and so that heat from the LED-package 7 will dissipate via the copper layer 8 and the heat sink body 2 out to the surrounding.

The heat sink element may be not only thermally, but also electrically, connected to the circuit layer. For example, it may be electrically connected to one or both of the terminals for the LED-package, or be connected to a so called "heat slug" of the LED package. An electrical terminal that the optical heat sink is connected to is preferably made large enough to fit the footprint of a connection part of the heat sink body (the part in contact with the substrate). Such a LED package terminal may therefore be much larger in surface area than a regular LED package terminal.

To create a satisfactory beam shape, the optical interface 2 of the heat sink element may have a parabolic shape, like the reflector in a car headlamp. Since the LED package 7 is usually rectangular, it may, however, be more practical to make also the optical interface, and thereby the entire heat sink element, rectangular. For simplicity, and since a collimated beam shape is not always desired, the shape of the optical interface 2 may be made as a flat surface, angled away from the LED, taking the shape of a cup that is not parabolic, but still has a smaller area at the base/PCB than at the top (away from the PCB).

Figures 2A, 2B, 2C:
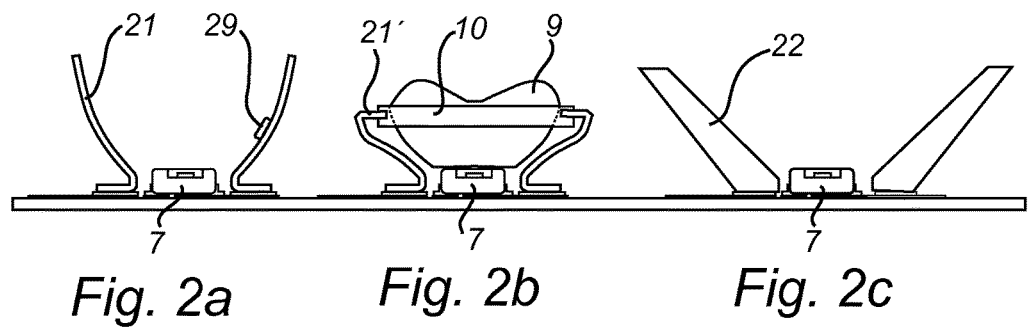
FIG. 2a is a cross sectional view of an embodiment where the heat sink element is a metal sheet shaped in a parabolic shape.
FIG. 2b is a cross sectional view of an embodiment where the heat sink element comprises a lens that is positioned just above the LED.
FIG. 2c is a cross sectional view of an embodiment where the heat sink element is a white cup.

FIG. 2a shows a cross sectional view of an embodiment where the optical heat sink 1 is made of a metal sheet 21 shaped in a parabolic shape. The metal sheet, will by itself provide the optical heat sink body 2, 21, the optical interface 3, 21, the thermal interface 4, 21 and solder connection 5, 21. The embodiment using metal sheet 21 provides a cheap but in many cases satisfactory solution. The metal sheet may have different shapes. In FIG. 2, the sheet has a parabolic shape, creating a fairly parallel beam shape from the LED, but the shape could also be straight as a cup, or any other wanted shape. The metal sheet may be used as a foundation for any coating that could be desired, e.g., as a foundation in the embodiment of FIG. 2c.

If the heat sink element is electrically connected between two connection points on the circuit layer, it will form part of the electrical circuit, and may thus include electrical components that can be powered and controlled through the circuit layer. The electrical components may be for example light sensors, actuators, etc. This is illustrated schematically in FIG. 2b by component 29. A light sensor may be, e.g., a light meter (Lm), a CTT etc, and can be arranged to measure properties such as intensity or color of the emitted light. The actuator could be, e.g., a shutter affecting the reflector, collimator, or lens according to the embodiments above. By using sensors that are attached on the thermal heat sink, measurements by the sensors may be used to actually control the beam, e.g., with direct feedback control from a light sensor. As an example, FIG. 2b shows a cross sectional view of an embodiment where the optical heat sink has a lens 9 that is positioned just above the LED. The lens 9 is held by a folded metal sheet 21' that serves as thermal and optionally also as reflective optical interface. The metal sheet 21' holds the lens 9 in a holding device 10, attached to hold the lens 9. The optical design for LED lighting products typically has to manage two functions, lowering source brightness and beam shaping. The described embodiment of the present invention involves near die optics that are especially useful for the latter function. Solving the beam shaping problem on a board level limits the optical design on the luminaire level only to lowering the source brightness.

It should be noted that the lens may, in accordance with the invention, have its lower surface 23 covered by a phosphor coating to provide wavelength conversion of the LED emission. The phosphor coating will then fully replace the functionality of having phosphor coated directly on the LED-die. The remaining surfaces of the lens 9 could also be covered by phosphor coating to provide a more complete wavelength conversion, at the expense of the lens effect. The latter could, however still be interesting if the lens is a cheap molded lens, to reduce the number of possible components in a production facility.

The lens 9 may be a clear lens. However, if diffuse light is desired the lens may be replaced by any other a similar sized optical component, held by the heat sink element. For example, the lens can be made of a transparent material with phosphor particles molded into it. The optics of the heat sink element will then serve to reflect also phosphorescence that is emitted in the wrong direction from the phosphor particles.

FIG. 2c shows a cross sectional view of an embodiment where the optical heat sink is a white cup 22. The white surface diffuses the light from the LED and gives it less direction. The surface serves to reduce the brightness perceived by a person looking at the LED-device.

Figures 3A, 3B:
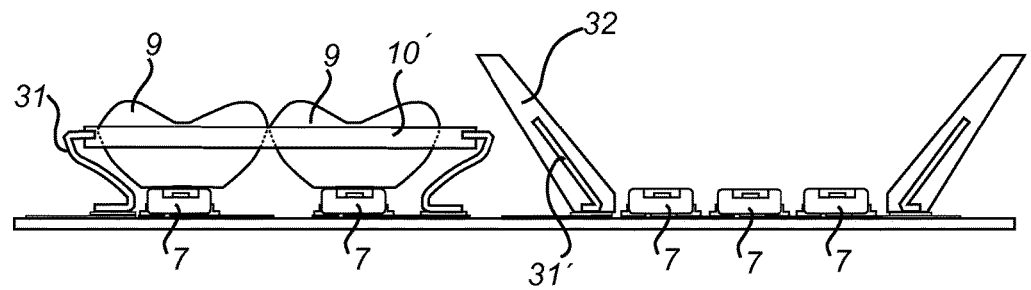
FIG. 3a is a cross sectional view of an embodiment where the heat sink element with lenses is placed around multiple LEDs.
FIG. 3b is a cross sectional view of an embodiment where the heat sink element is a white cup placed around multiple LEDs.

FIG. 3a shows a cross sectional view of an embodiment where an optical heat sink having attached clear lenses is placed around multiple LEDs. One clear lens 9 per LED 7 is held by a folded metal sheet 31 and the lens holding device 10'.

FIG. 3b shows a cross sectional view of an embodiment where the optical heat sink is a white cup 32 placed around multiple LEDs. A metal sheet 31' is incorporated into the white cup to lead heat from the LED package 7 via the circuit layer. The white material could be plastic with strongly diffusing properties as in FIG. 2c, but it could also be a phosphor containing material having incorporated phosphor particles for light wavelength conversion.

FIG. 4a-i shows parts and layers of two possible embodiments of the present invention. In FIG. 4a the PCB layout of two embodiments 41, 42 are shown. The embodiment 41 to the left has one LED-package, while the embodiment 42 to the right has eight LED-packages. FIG. 4b shows the copper layer layout, FIG. 4c shows the LED footprint, and FIG. 4d shows the optical heat sink footprints of the two embodiments. FIG. 4e shows a perspective view of the two embodiments of the PCB layout with LEDs, basically a combination of FIG. 4a and FIG. 4c, while FIG. 4f shows the two embodiments of FIG. 4e with the metal parts of the optical heat sink added. The metal parts in this embodiment are folded metal sheet as shown in FIG. 4h and FIG. 4i. In FIG. 4g the two embodiments of FIG. 4f are supplied with material covering the metal parts to provide embodiments with white cup optical interfaces.

It is understood that other variations in the present invention are contemplated and in some instances, some features of the invention can be employed without a corresponding use of other features. Accordingly, it is appropriate that the appended claims be construed broadly in a manner consistent with the scope of the invention.

The invention claimed is:
1. A light emitting device comprising:
a substrate having an electrically conducting circuit layer,
a LED package surface mounted on said substrate and electrically connected to said circuit layer, wherein said LED package includes at least one terminal; and
a heat sink element, surface mounted on said substrate separately from said LED package, forming a surface mount between said heat sink element and said substrate, said heat sink element having a body of a heat conductive material surrounding said LED package, said body being thermally connected to said circuit layer, and being adapted to provide heat dissipation from said circuit layer to a surrounding environment, the at least one terminal extending to the surface mount between said heat sink element and said substrate, such that the heat sink element is connected to the at least one terminal;

wherein a surface of said heat sink element facing said LED package is adapted to form part of a beam shaping optics for shaping light emitted from said LED package and a light sensor electrically connected to the beam shaping optics formed by the surface of the heat sink element, said light sensor being positioned to receive light emitted by the LED package;

wherein said heat sink element is electrically connected between at least two connection points, through said surface mount between said heat sink element and said substrate, to said circuit layer, such that said heat sink element forms part of an electrical circuit and conducts current, such the light sensor is powered by the current conducted by the heat sink element.

2. The light emitting device according to claim 1, wherein the body is a metal sheet folded to a cup-shape.

3. The light emitting device according to claim 1, wherein said body is made of a metal.

4. The light emitting device according to claim 1, wherein said body is made of at least partly transparent material.

5. The light emitting device according to claim 1, wherein said surface of said body facing said LED package is transparent, highly reflective, Lambertian reflective or specular.

6. The light emitting device according to claim 1, wherein said surface of said body facing said LED package is provided with a phosphorescent material adapted to convert the color of the LED radiation.

7. The light emitting device according to claim 1, wherein the heat sink element comprises two parts, each part being separated from the other part, each part thermally connected to said circuit layer.

8. The light emitting device according to claim 1, wherein the heat sink element is soldered to said circuit layer.

9. A method of assembling a light emitting device, said method comprises the steps of:

providing a surface of a substrate with an electrically conducting circuit layer;

surface mounting a LED-package on said substrate, in electrical connection with said circuit layer, wherein said LED package includes at least one terminal;

surface mounting a separate heat sink element on said substrate, adjacent to said LED package, such that a surface mount between said heat sink element and said substrate is formed, and such that said heat sink element is brought into thermal connection with said circuit layer, so as to provide heat dissipation from said circuit layer to a surrounding environment, the at least one terminal extending to the surface mount between said heat sink element and said substrate, such that the heat sink element is connected to the at least one terminal; and electrically connecting a light sensor solely to the beam shaping optics formed by the surface of the heat sink element, said light sensor being positioned to receive light emitted by said LED package;

wherein said heat sink element is electrically connected between at least two connection points, through said surface mount between said heat sink element and said substrate, to said circuit layer, such that said heat sink element forms part of an electrical circuit and conducts current, such that the light sensor is powered by the current conducted by the heat sink element.

* * * * *